(12) United States Patent
Nishi et al.

(10) Patent No.: US 10,566,763 B2
(45) Date of Patent: Feb. 18, 2020

(54) UNDERWATER LASER LIGHT SOURCE

(71) Applicant: SHIMADZU CORPORATION, Kyoto (JP)

(72) Inventors: Ryosuke Nishi, Kyoto (JP); Koji Tojo, Kyoto (JP); Naoki Nishimura, Kyoto (JP)

(73) Assignee: SHIMADZU CORPORATION, Kyoto (JP)

( * ) Notice: Subject to any disclaimer, the term of this patent is extended or adjusted under 35 U.S.C. 154(b) by 0 days.

(21) Appl. No.: 16/292,659

(22) Filed: Mar. 5, 2019

(65) Prior Publication Data
US 2019/0305521 A1  Oct. 3, 2019

(30) Foreign Application Priority Data

Mar. 29, 2018 (JP) ................. 2018-063804

(51) Int. Cl.
| H01S 5/00 | (2006.01) |
| H01S 5/024 | (2006.01) |
| H01S 5/40 | (2006.01) |
| H01S 5/022 | (2006.01) |
| H01S 5/02 | (2006.01) |

(52) U.S. Cl.
CPC ........... *H01S 5/02469* (2013.01); *H01S 5/02* (2013.01); *H01S 5/02284* (2013.01); *H01S 5/02296* (2013.01); *H01S 5/4012* (2013.01); *H01S 5/4087* (2013.01); *H01S 5/005* (2013.01); *H01S 5/4025* (2013.01)

(58) Field of Classification Search
CPC .. H01S 5/4012; H01S 5/02284; H01S 5/4087; H01S 5/02469; H01S 5/02296; H01S 5/4025
See application file for complete search history.

(56) References Cited

U.S. PATENT DOCUMENTS

| 5,402,786 A | * | 4/1995 | Drummond | ............ G01H 9/004 324/318 |
| 6,934,014 B1 | * | 8/2005 | Kleinhuber | .......... B23K 26/032 219/121.74 |
| 10,233,943 B2 | * | 3/2019 | Moriyama | .......... F04D 29/5813 |
| 2008/0088821 A1 | * | 4/2008 | Hurvitz | .............. G01N 21/0332 356/51 |
| 2019/0109433 A1 | * | 4/2019 | Takigawa | ................ H01S 5/022 |
| 2019/0129108 A1 | * | 5/2019 | Tan | ...................... G02B 6/4248 |

FOREIGN PATENT DOCUMENTS

JP  2009-55408  3/2009

* cited by examiner

*Primary Examiner* — Kinam Park
(74) *Attorney, Agent, or Firm* — Andrew F. Young, Esq.; Lackenbach Siegel, LLP

(57) ABSTRACT

An underwater laser source is used in water and comprises a water pressure-resistant cylinder A having a light emission window 4, and the water pressure-resistant cylinder A comprises a plurality of semiconductor lasers 11*a*-11*f*, and converging lens 13 that converges each laser light from the plurality of semiconductor lasers 11*a*-11*f*, and emits converged each laser light to the light emission window 4.

7 Claims, 3 Drawing Sheets

UNDERWATER LASER LIGHT SOURCE

CROSS REFERENCE TO RELATED APPLICATIONS

This application relates to, and claims priority from, JP 2018-063804 filed Mar. 29, 2018, the entire contents of which are incorporated herein by reference.

FIGURE SELECTED FOR PUBLICATION

FIG. 1

BACKGROUND OF THE INVENTION

Field of the Invention

The present invention relates to a communication technology, an underwater technology, an underwater optical wireless communication, an underwater ranging (distance measurement) and an underwater laser light source for performing detection of underwater light.

Description of the Related Art

To date, an underwater robotic technology for an underwater search (exploration) is dramatically developed and nowadays, an autonomous unmanned submersible vehicle (AUV) is being developed. An improvement of communications capacity relative to the wireless communication technology between the underwater robots and between the underwater robot and the surface boat and so forth is aspired to effectively run the underwater robot first, such as AUV for the underwater resource exploration and so forth. Conventionally, an acoustic communication, which uses a sonic (acoustic) wave of which signal slowly attenuates underwater is mainly being applied to the underwater wireless communication means (tool).

Whereas, underwater, a propagation rate of the acoustic wave is low, and the frequency thereof is also low, so that only a slow communication in the extent of 10 kbps (kilobits per second) is available. Accordingly, the acoustic wave is incapable of sending and receiving a large volume of data of an image and a video, so that the acoustic wave communication fails to meet satisfactorily the requirement for the underwater robotic exploration.

Therefore, an optical communication technology is the technology that draws an attention as the underwater wireless communication means enabling a high-speed wireless communication. The light having the visible light wavelength relatively less attenuates even though a bit faster than the acoustic wave and enables a high-speed communication underwater by using a device such as a LED (laser emission diode) and a LD (laser diode), which enables a high-speed modulation.

RELATED PRIOR ART DOCUMENTS

Patent Document

Patent Document 1: JP Patent Published 2009-55408 A1

ASPECTS AND SUMMARY OF THE INVENTION

Whereas the underwater optical communication technology enables the high-speed communication, the strength of the signal attenuates below water. For example, the light attenuation below water is −0.5 dB/m even under the condition in which transmittance of the visible light is higher due to relatively better water quality. Specifically, the light intensity attenuates by approximately one third at 10 m away.

At the same time, the light radiated from the light source gradually disperse, and the farther from the light source, the larger the light density decreases. The expectancy distance for the underwater optical communication technology is at least in the range of approximately 10 m to 100 m, and under consideration of the attenuation of the light intensity; it is very critical how far the strong light is reachable.

Minimizing the dispersion of the light radiated from the light source is quite effective to suppress the attenuation of the light below water as much as possible. For such a purpose, the laser light having a high-directionality is suitable as the light source thereof.

In addition, now, the visible light laser diode (LD) that provides a light output in the level of watt even with a low-power consumption is easily available to apply along with the recent development of the semiconductor laser technology.

On the other hand, in water, it is not always guaranteed that the quality of water is in a good condition, and it is difficult to narrow down the laser light to the utmost limit from the adjustment point of the light-axes. When the optical communication is carried out under the environment having the unfavorable quality of water and in the state in which laser light disperses, the light output-power having approximately 1-2 W (watt) as for the single LD is unsatisfactory to achieve the underwater optical wireless communication technology in the extent of several ten meters to 100 meters. Therefore, a maximization of the power output of the LD light source is the biggest issue to bring the underwater optical wireless communication technology into reality.

In addition, when an amount of heat generation of the LD light source increases along with maximization of the high-power output of the LD light source, it is difficult to cool the LD and LED (light-emitting diode) in air in the closed (air-tight and waterproof) water pressure-resistant cylinder (container) and as a result, decreasing the emission intensity therefrom and shortening the lifetime thereof occur. Therefore, a whole of the light source must be cooled to send the stable and high-power output light.

The purpose of the present invention is to provide an underwater laser light source for which maximization of the high-power output is achieved and in which the semiconductor laser generating heat is cooled.

Means for Solving the Problem

An underwater laser light source, according to the aspect of the invention of the present invention, that is used below water, comprises a water pressure-resistant cylinder having a light emission window, and the water pressure-resistant cylinder further comprises a plurality of semiconductor lasers and a converging lens that converges each laser light from the plurality of semiconductor lasers and emit each converged laser light through the light emission window of the water pressure-resistant cylinder.

According to another aspect of the invention, the water pressure-resistant cylinder further comprises an optical fiber to which each laser light converged by the converging lens is incident and from which each incident laser light is emitted to the light emission window.

According to another aspect of the invention, the plurality of semiconductor lasers is in-place at the one (first) end of the water pressure-resistant cylinder as contacting therewith, the light emission window is in-place at the other (second) end of the water pressure-resistant cylinder as facing the first end and an emission side end of the optical fiber is in-place near the light emission window.

According to another aspect of the invention, the plurality of semiconductor lasers comprises a plurality of semiconductor laser groups of which a center wavelength differs from each other.

An underwater laser light source, according to the aspect of the invention of the present invention, that is used below water, comprises a water pressure-resistant cylinder having a light emission window, and the water pressure-resistant cylinder further comprises a single semiconductor laser and a converging lens that converges laser light from the single semiconductor lasers, an optical fiber to which the converged laser light is incident, and a light emission window through which the laser light coming out from the optical fiber emits outside.

According to another aspect of the invention, the single semiconductor lasers is in-place at the one (first) end of the water pressure-resistant cylinder as contacting therewith, the light emission window is in-place at the other (second) end of the water pressure-resistant cylinder as facing the first end and an emission side end of the optical fiber is in-place near the light emission window.

Effects of the Present Invention

According to the aspect of the present invention, each laser light from a plurality of semiconductor lasers converges on the convergence lens, so that each laser light converging on the converging lens achieves maximization of the high-power output.

In addition, such laser lights are incident to one optical fiber, so that the laser rays passing through the optical fiber can be handled as one laser beam.

In addition, the light emission unit separates from the semiconductor laser, which is a heat generation source, by the in-between optical fiber, and the semiconductor laser generating heat is in-place contacting with the one end of the water pressure-resistant cylinder, so that the semiconductor lasers cool down together with the water pressure-resistant cylinder is being cooled down in water. Therefore, the water cools down the plurality of the semiconductor lasers generating heat.

The above and other aspects, features and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
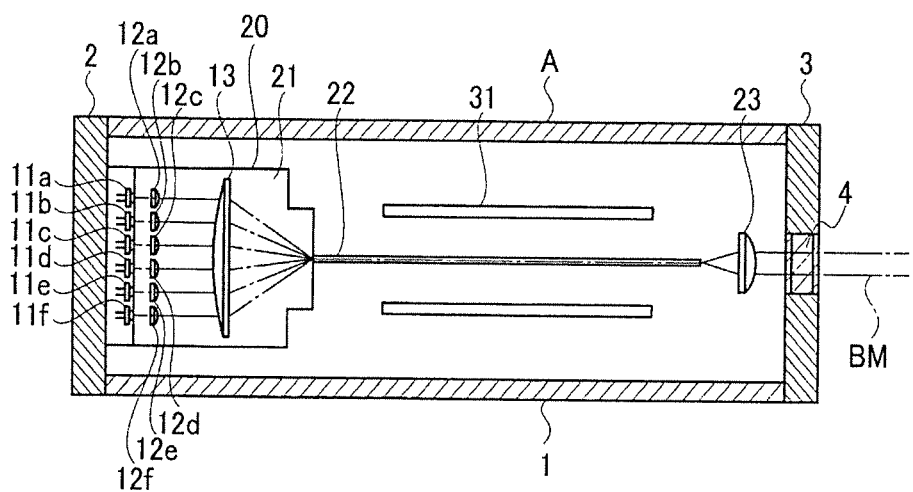
FIG. 1 is a block diagram illustrating an underwater laser source according to the aspect of the Embodiment 1 of the present invention.

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

Various operations may be described as multiple discrete operations in turn, in a manner that may be helpful in understanding embodiments of the present invention; however, the order of description should not be construed to imply that these operations are order dependent.

Embodiment 1

FIG. 1 is the block diagram illustrating the underwater laser source according to the aspect of the Embodiment 1 of the present invention. Referring to FIG. 1, such an underwater laser source is applied to e.g., a laser light source for an underwater optical wireless communication device and comprises a water pressure-resistant cylinder A for being used in water. The water pressure-resistant cylinder A comprises a cylinder 1, a cap (end-cap) 2 installed to the one end of the cylinder 1, and a cap 3 with a window (window end-cap) installed to the other end of the cylinder 1 as facing the one end.

The water pressure-resistant cylinder A comprises a plurality of semiconductor lasers 11a-11f, a plurality of collimator lens 12a-12f, a converging lens 13, an optical fiber 22, a laser light control substrate 31 and a laser light directivity control lens 23 inside thereof.

The plurality of semiconductor lasers 11a-11f, the plurality of collimator lens 12a-12f, and the converging lens 13 are housed in the housing 20. The collimator lens 12a-12f and the converging lens 13 consists of a light converging (collection) optical system 21.

The plurality of semiconductor lasers 11a-11f, which are in-place at specified (predetermined) distance intervals and so as to contact with the end-cap 2 as the one of the water pressure-resistant cylinder A, emits a laser light (a visible light having a wavelength in the range of approximately 350 nm to 850 nm. A light emission window 4 is in-place as a part of the window end-cap 3 facing the end-cap 2 of the water pressure-resistant cylinder A and the emission side of the optical fiber 22 is in-place nearby the emission window 4.

The plurality of collimator lens 12a-12f that are in-place facing a plurality of semiconductor lasers 11a-11f collimates each laser light from the plurality of semiconductor lasers 11a-11f and then, guides such a collimated laser light to the converging lens 13.

The converging lens 13 converges each laser light out of the collimator lens 12a-12f and guides to the optical fiber 22. The optical fiber 22 emits each incident laser light out of the collimator lens 12a-12f as a laser light through the emission end of the fiber per se.

The laser light directivity control lens 23 adjusts the laser light out of the optical fiber 22 so as to have a predetermined broadening angle and emits (guides) into water through the light emission window 4.

In addition, the laser light coming out from the optical fiber 22 may be guided directly to the outside of the water pressure-resistant cylinder A without embedding the laser light directivity control lens 23.

In addition, a space is present in the periphery of the optical fiber 22. In such a space, a laser light control substrate 31 is in-place having a control circuit that subjects a plurality of semiconductor lasers 11a-11f to a pulse drive. Therefore, a limited space inside the water pressure-resistant cylinder A is effectively leveraged.

According to the aspect of the Embodiment 1, with respect to the underwater laser source, each laser light emitted from the plurality of semiconductor lasers 11a-11f converges on the converging lens 13, so that each laser light converging on the converging lens 13 achieves maximization of the high-power output.

In addition, laser lights are incident to the one optical fiber 22, so that the laser lights coming out (emitted) from the optical fiber 22 can be handled as one laser beam BM.

In addition, the semiconductor lasers 11a-11f as heat sources contact with the end-cap 2 of the water pressure-resistant cylinder A resulting in cooling down. Whereas, the laser light coming out from the emission side end (light emission end) of the optical fiber 22 is emitted through the light emission window 4 placed in the other end facing the end-cap 2 of the water pressure-resistant cylinder A. Accordingly, the heat source separates from the light emission end.

Embodiment 2

Figure 2:
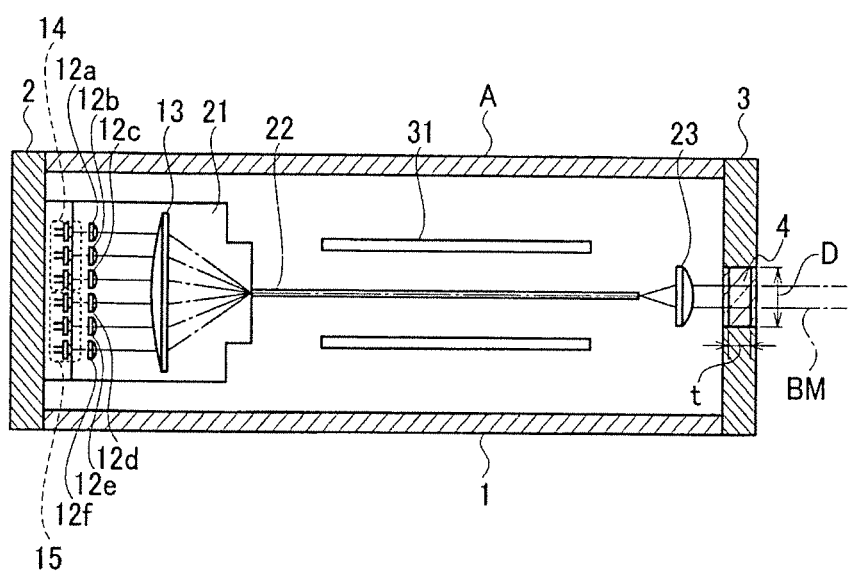
FIG. 2 is a block diagram illustrating an underwater laser source according to the aspect of the Embodiment 2 of the present invention.

FIG. 2 is the block diagram illustrating the underwater laser source according to the aspect of the Embodiment 2 of the present invention. Referring to FIG. 1, with respect to the underwater laser source according to the aspect of the Embodiment 2, the plurality of semiconductor lasers 11a-11f comprises a first LD group 14 and a second LD group 15, which have a central wavelength that differs from each other.

The first LD group 14 comprises three semiconductor lasers having the central wavelength having the first wavelength $\lambda_1$. The second LD group 15 comprises three semiconductor lasers having the central wavelength having the second wavelength $\lambda_2$.

With respect to the underwater laser source according to the aspect of the Embodiment 2, the single laser light source for underwater optical wireless communication emits laser lights having a plurality of wavelengths at the same time. Or the laser lights having a plurality of wavelengths can be emitted following switching such plurality of wavelengths.

In addition, the plurality of wavelengths emitted from the laser light source for underwater optical wireless communication are selectable in accordance with quality of water.

In addition, the water-pressure is provided to the light emission window 4 of the water pressure-resistant cylinder A in water. Therefore, referring to FIG. 2, the light emission window 4 has the thickness t and the effective diameter D to achieve a pressure-resistance depending on the depth of water. In such a way, the effective diameter D of such a window can be smaller and the thickness t thereof can be thinner, so that the cost-cutting for the underwater laser source is feasible.

In addition, the diameter of the beam emitted from the emission end of the optical fiber 22 is controllable (adjustable) to fit in the effective diameter D of the light emission window 4 by controlling (adjusting) the location of the collimator lens 12a-12f. In such a way, the laser light BM is radiated through the light emission window 4 having such a smaller diameter below water.

Embodiment 3

Figure 3:
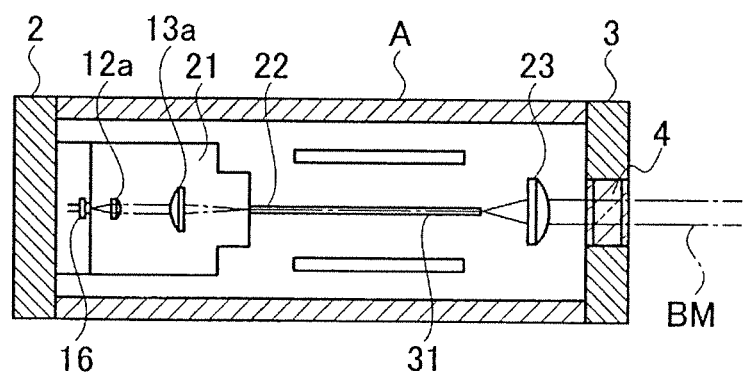
FIG. 3 is a block diagram illustrating an underwater laser source according to the aspect of the Embodiment 3 of the present invention.

FIG. 3 is the block diagram illustrating the underwater laser source according to the aspect of the Embodiment 3 of the present invention. According to the aspect of the Embodiment 3, the underwater laser source comprises a water pressure-resistant cylinder A comprising a single semiconductor laser 16, a collimator lens 12a, a converging lens 13a on which the laser light coming out from the collimator lens 12a converges, an optical fiber 22 to which the converged light through the converging lens 13a is incident, and a light emission window 4 through which the laser light coming out from the optical fiber 22 emits into water.

The single semiconductor laser 16 is in-place contacting with the end-cap 2 at the one end of the water pressure-resistant cylinder A, the light emission window 4 is in-place at the other end of the water pressure-resistant cylinder A facing the end-cap 2, and the circular emission end of the optical fiber 22 is in-place nearby the light emission window 4.

With regard to the underwater short distance communication, when the output power of one semiconductor laser meets well a necessity therefor and also, when the semiconductor laser 11a is the light source having an oval type and providing the broadening angles in the vertical and horizontal directions that differ from each other, the laser beam can be shaped to a circular beam by passing the laser beam, having the broadening angles in the vertical and horizontal directions that differ from each other, emitted from the single semiconductor laser 16 through the circular optical fiber 22.

As a result, the broadening angle of the beam due to using a lens can be easily adjusted resulting in improvement of probability of the sending and receiving signal relative to the underwater optical wireless communication.

In addition, the single semiconductor laser 16 is in-place contacting with the end-cap 2 at the one end of the water pressure-resistant cylinder A, the light emission window 4 is in-place to the other end facing the end-cap 2 of the water pressure-resistant cylinder A, and the emission end of the circular optical fiber 22 is in-place nearby the light emission window 4.

Accordingly, as well as the effect relative to the laser light source according to the aspect of the Embodiments 1, 2, the semiconductor laser 11a as the heat generation source contacts with the end-cap 2 of the water pressure-resistant cylinder A resulting in cooling down. Whereas, the laser light coming out from the emission side (light emission end) of the optical fiber 22 is emitted through the light emission window 4 placed in the other end facing the end-cap 2 of the water pressure-resistant cylinder A. Accordingly, the heat source separates from the light emission end.

INDUSTRIAL APPLICABILITY

The present invention is applicable to the communication technology, the underwater technology, the underwater optical wireless communication, the underwater ranging (distance measurement) and the underwater laser light source for performing detection of underwater light.

A Water pressure-resistant cylinder
1 Cylinder
2 End-cap
3 End-cap window (cap with a window)
4 Light emission window
11a-11f, 16 Semiconductor laser
12a-12f Collimator lens
13, 13a Light converging lens
14 First laser diode (LD) group
15 Second laser diode (LD) group
21 Light converging optical system
22 Optical fiber
23 Laser beam directionality control lens
31 Laser beam control substrate
BM Laser beam (Beam Laser)

Also, the inventors intend that only those claims which use the words "means for" (used in required combination of 'means+for') are intended to be interpreted under 35 USC 112(f)/sixth paragraph. Moreover, no limitations from the specification are intended to be read into any claims, unless those limitations are expressly included in the claims.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. An underwater laser source, that is used in water, comprising:
    a water-pressure resistant cylinder having a light emission window, wherein said water pressure-resistant cylinder further comprises:
    a plurality of semiconductor lasers; and
    a converging lens that converges each laser light emitted from said plurality of semiconductor lasers inside said water pressure-resistant cylinder, wherein said converging lens emits each converged laser light through said light emission window.

2. The underwater laser source, according to claim 1, further comprising:
    an optical fiber; wherein each laser light converged through said converging lens is incident to said optical fiber that emits each incident laser light through said light emission window.

3. The underwater laser source, according to claim 2, wherein:
    said plurality of semiconductor lasers are in-place contacting with a first end of said water pressure-resistant cylinder, said light emission window is in-place at a second end of said water pressure-resistant cylinder facing said first end, and said emission end of said optical fiber is in-place nearby said light emission window.

4. The underwater laser source, according to claim 1, wherein:
    said plurality of semiconductor lasers comprises a plurality of semiconductor laser groups, and a center wavelength thereof differs from each other.

5. An underwater laser source, that is used in water, comprising:
    a water-pressure resistant cylinder having a light emission window; wherein said water pressure-resistant cylinder further comprises:
    a single semiconductor laser;
    a converging lens that converges laser lights emitted from said single semiconductor laser;
    an optical fiber to which a converged laser light through said converging lens is incident; and
    a laser light coming out from said optical fiber is emitted into water through said light emission window.

6. The underwater laser source, according to claim 5, wherein:
    said single semiconductor lasers are in-place contacting with a first end of said water pressure-resistant cylinder, said light emission window is in-place at a second end of said water pressure-resistant cylinder facing said first end, and an emission end of said optical fiber is in-place nearby said light emission window.

7. The underwater laser source, according to claim 1, wherein:
    a central wavelength of said semiconductor lasers is in a range of 350 nm to 850 nm.

* * * * *